(12) United States Patent
Soga et al.

(10) Patent No.: US 12,424,982 B2
(45) Date of Patent: Sep. 23, 2025

(54) POWER AMPLIFIER CIRCUIT

(71) Applicant: Murata Manufacturing Co., Ltd., Kyoto (JP)

(72) Inventors: Takashi Soga, Kyoto (JP); Tsutomu Oonaro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 583 days.

(21) Appl. No.: 17/808,624

(22) Filed: Jun. 24, 2022

(65) Prior Publication Data

US 2022/0416728 A1    Dec. 29, 2022

(30) Foreign Application Priority Data

Jun. 28, 2021    (JP) .................................. 2021-106867

(51) Int. Cl.
| | |
|---|---|
| *H03F 3/04* | (2006.01) |
| *H03F 1/30* | (2006.01) |
| *H03F 3/195* | (2006.01) |
| *H03F 3/24* | (2006.01) |

(52) U.S. Cl.
CPC ............. *H03F 1/302* (2013.01); *H03F 3/195* (2013.01); *H03F 3/245* (2013.01); *H03F 2200/451* (2013.01)

(58) Field of Classification Search
CPC .......... H03F 1/302; H03F 3/195; H03F 3/245; H03F 2200/451; H03F 2200/18; H03F 1/0266; H03F 3/211; H03F 3/19; H03F 3/4508; H03F 3/04; H03F 1/301; H03F 1/0261; H03G 3/3036; H03G 1/30; H03G 3/3042; H03G 3/3047
USPC .................................................. 330/285, 296
See application file for complete search history.

(56) References Cited

U.S. PATENT DOCUMENTS

| | | | |
|---|---|---|---|
| 6,778,018 B2* | 8/2004 | Joly .......................... | H03F 1/26 330/296 |
| 7,271,656 B2* | 9/2007 | Joly ........................ | H03F 3/195 330/285 |
| 7,633,346 B2* | 12/2009 | Oishi ...................... | H03F 1/301 330/296 |
| 2003/0016083 A1 | 1/2003 | Joly et al. | |
| 2015/0130537 A1 | 5/2015 | Nakamura et al. | |

FOREIGN PATENT DOCUMENTS

JP    2015-095708 A    5/2015

* cited by examiner

*Primary Examiner* — Khanh V Nguyen
(74) *Attorney, Agent, or Firm* — McDonald Hopkins LLC (57) ABSTRACT

A power amplifier circuit includes: a transistor which is supplied at a base with a bias current, amplifies an input signal, and outputs a current; a transistor which is connected at a base to the base of the transistor and in which a current commensurate with the current is input to a collector; a transistor which outputs a bias control signal which controls supply of the bias current; and a control circuit which is connected to the collector of the transistor and a gate of the transistor and controls a bias control signal on the basis of a reference current based on a reference signal and the current.

7 Claims, 9 Drawing Sheets

POWER AMPLIFIER CIRCUIT

CROSS REFERENCE TO RELATED APPLICATION

This application claims priority from Japanese Patent Application No. 2021-106867 filed on Jun. 28, 2021. The content of this application is incorporated herein by reference in its entirety.

BACKGROUND ART

The present disclosure relates to a power amplifier circuit.

Methods for controlling output power from a power amplifier circuit include a method that controls input power by keeping a gain of the power amplifier circuit constant and a method that controls the gain of the power amplifier circuit by keeping the input power constant. In a communication system, such as the global system for mobile communications (GSM®), output power is controlled by controlling a gain of a power amplifier circuit while keeping input power constant.

Japanese Unexamined Patent Application Publication No. 2015-95708 illustrates a power amplification module which controls output power by controlling a gain of a power amplifier circuit while keeping input power constant. In the power amplification module described in Japanese Unexamined Patent Application Publication No. 2015-95708, the gain of the power amplifier circuit is controlled by controlling a power supply voltage of an amplifier and a current input to a bias circuit.

BRIEF SUMMARY

In a power amplification module as described in Japanese Unexamined Patent Application Publication No. 2015-95708, a variable-voltage circuit which supplies a power supply voltage to an amplifier is used. The variable-voltage circuit supplies a variable power supply voltage to the amplifier on the basis of a power supply voltage which is supplied to the variable-voltage circuit itself. When a voltage drop occurs in the variable-voltage circuit at this time, the variable power supply voltage reduces. This may reduce output power from the amplifier.

If a gain of a power amplifier circuit is controlled only by controlling a current to be input to a bias circuit without necessarily using a variable-voltage circuit, controllability of the power amplifier circuit may reduce in a low-output-power region. Even if output power is in the low-output-power region, a bias current of an amplifier based on the current input to the bias circuit may have a magnitude not less than a predetermined value in order to achieve a predetermined gain. In this case, even if the amplifier is desired to be turned off by the bias current, the amplifier can be turned on. Thus, the controllability of the power amplifier circuit may reduce.

The present disclosure provides a power amplifier circuit capable of improving output power controllability.

A power amplifier circuit according to an aspect of the present disclosure includes: a first transistor which is supplied at a base or a gate with a bias current, amplifies an input signal, and outputs a first current; a second transistor which is connected at a base or a gate to the base or the gate of the first transistor and is supplied at a collector or a drain with a second current commensurate with the first current; a third transistor which outputs a bias control signal which controls supply of the bias current; and a control circuit which is connected to the collector or the drain of the second transistor and a base or a gate of the third transistor and controls the bias control signal on the basis of a reference current based on a reference signal and the second current.

According to the present disclosure, it is possible to provide a power amplifier circuit capable of improving output power controllability.

DETAILED DESCRIPTION

Figure 1:
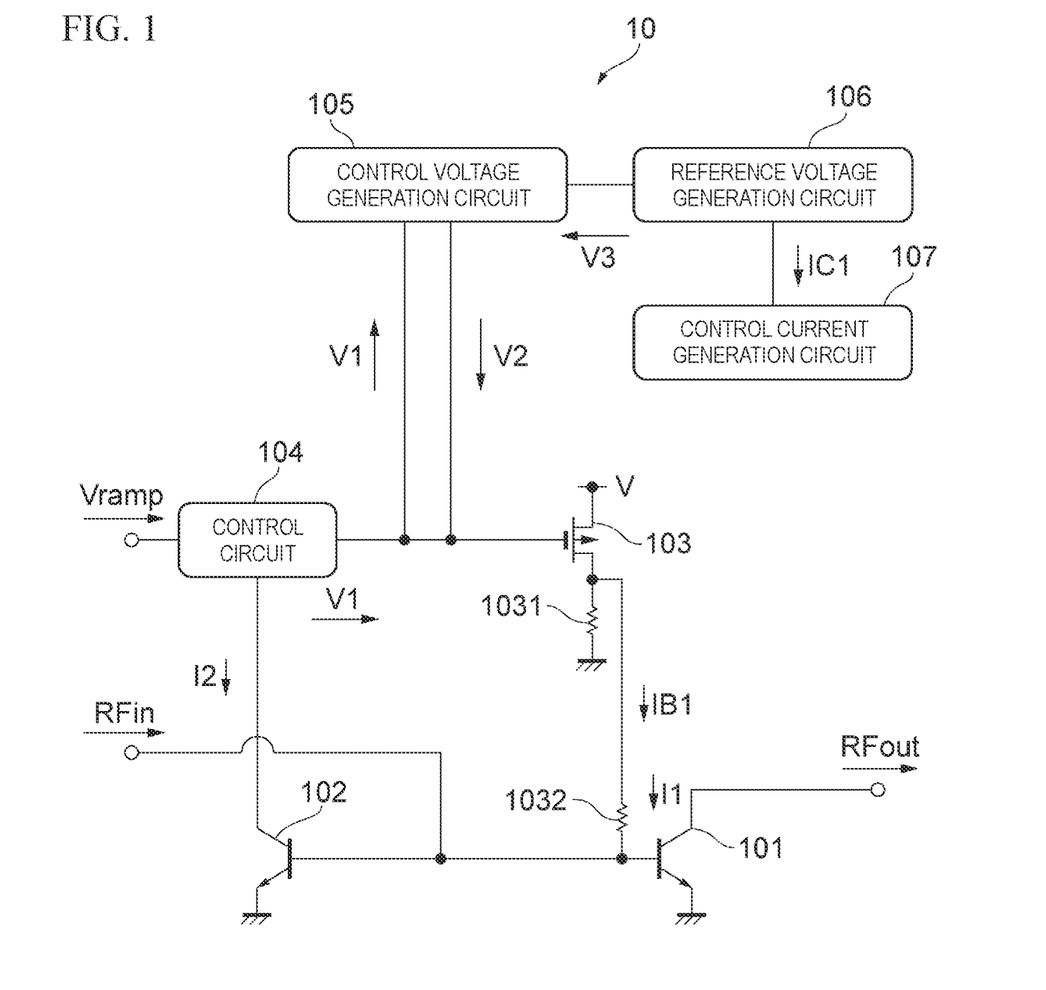
FIG. 1 is a schematic circuit diagram of a power amplifier circuit according to a first embodiment.

A first embodiment will be described. A schematic circuit diagram of a power amplifier circuit according to the first embodiment is shown in FIG. 1. A power amplifier circuit 10 includes transistors 101, 102, and 103, a control circuit 104, a control voltage generation circuit 105, a reference voltage generation circuit 106, and a control current generation circuit 107.

In the transistor 101 (a first transistor), a base is connected to an input, a collector is connected to an output, and an emitter is connected to a ground. An input signal RFin and a bias current IB1 are input to the base. The transistor 101 amplifies the input signal RFin and outputs an output signal RFout from the collector. A current I1 (a first current) flows to the collector of the transistor 101.

In the transistor 102 (a second transistor), a base is connected to the base of the transistor 101, a collector is connected to the control circuit 104, and an emitter is connected to the ground. A current I2 (a second current) based on the input signal RFin and the bias current IB1 flows through the collector of the transistor 102. The current I2 is, for example, a current one-nth of the current I1 depending on a difference in characteristics between the transistor 101 and the transistor 102. The current I2 is a current which simulates the current I1.

The transistors 101 and 102 are composed of bipolar transistors, such as heterojunction bipolar transistors (HBTs). Note that the transistors 101 and 102 may be composed of field-effect transistors, such as metal-oxide-semiconductor field-effect transistors (MOSFETs), instead of HBTs. In this case, a collector, a base, and an emitter to be described below may be read as a drain, a gate, and a source, respectively.

In the transistor 103 (a third transistor), a gate is connected to the control circuit 104 and the control voltage generation circuit 105, a source is connected to a power supply, and a drain is connected to a resistive element 1031 and a resistive element 1032. The transistor 103 is, for example, a P-channel MOSFET. The drain of the transistor 103 is connected to the ground through the resistive element 1031. The drain of the transistor 103 is also connected to the base of the transistor 101 and the base of the transistor 102 through the resistive element 1032.

The transistor 103 outputs the bias current IB1 from the drain in accordance with a bias voltage VB1 which is input to the gate. Here, a bias control signal can include the bias current IB1. In the drawings of the present embodiment, the bias current IB1 is shown. Note that a bias control signal can include a bias current itself and a signal for controlling the bias current in each embodiment.

The transistor 103 is composed of a field-effect transistor, such as a MOSFET. Note that the transistor 103 may be composed of an HBT. In this case, the drain, the gate, and the source may be read as a collector, a base, and an emitter, respectively.

The control circuit 104 is connected to the transistor 102, the transistor 103, and the control voltage generation circuit 105. A reference signal Vramp is supplied to the control circuit 104 in order to control operation of the power amplifier circuit 10. The control circuit 104 outputs a voltage V1 to the control voltage generation circuit 105 and the transistor 103 on the basis of the reference signal Vramp and the current I2. The control circuit 104 is a circuit which performs control that reduces the voltage V1 and reduces the bias current IB1 with increase in the current I2. Here, the reduction of the voltage V1 means changing the voltage V1 so as to reduce an absolute value of a gate voltage of the transistor 103. A voltage value of the gate voltage is increased if the transistor 103 is a P-channel MOSFET and is reduced if the transistor 103 is an N-channel MOSFET.

The control voltage generation circuit 105 is connected to the control circuit 104, the reference voltage generation circuit 106, and the transistor 103. The control voltage generation circuit 105 generates a control voltage V2 on the basis of the voltage V1 (a first reference voltage) from the control circuit 104 and a reference voltage V3 (a second reference voltage) from the reference voltage generation circuit 106. The control voltage generation circuit 105 supplies the control voltage V2 to the transistor 103.

The reference voltage generation circuit 106 is connected to the control voltage generation circuit 105 and the control current generation circuit 107. The reference voltage generation circuit 106 generates the reference voltage V3 and supplies the reference voltage V3 to the control voltage generation circuit 105. The reference voltage generation circuit 106 generates the reference voltage V3 on the basis of a control current IC1 from the control current generation circuit 107.

If a current amplification factor of the transistor 101 changes due to, for example, a change in a temperature of an external environment of the power amplifier circuit 10, the reference voltage generation circuit 106 generates the reference voltage V3 commensurate with the change. For example, when the current amplification factor increases, the reference voltage V3 reduces. More specifically, the reference voltage V3 changes so as to be inversely proportional to the current amplification factor of the transistor 101.

The control current generation circuit 107 is connected to the reference voltage generation circuit 106 and the power supply of the power amplifier circuit 10. The control current generation circuit 107 draws, from the reference voltage generation circuit 106, the control current IC1 commensurate with a change in a power supply voltage which is supplied to the power amplifier circuit 10. For example, if the power supply voltage changes so as to increase, the control current IC1 increases.

The operation of the power amplifier circuit 10 will be described.

In the power amplifier circuit 10, the current I1 flows to the collector of the transistor 101 in accordance with the input signal RFin and the bias current IB1. The current I2 flows to the collector of the transistor 102 in accordance with the current I1.

For example, when the current I1 increases, the current I2 increases. When the current I2 increases, the control circuit 104 reduces the voltage V1. When the voltage V1 reduces, the bias voltage VB1 to be applied to the gate of the transistor 103 reduces. When the bias voltage VB1 reduces, the bias current IB1 reduces. The reduction in the bias current IB1 reduces the current I1. In this manner, increase in the current I1 is curbed.

Thus, if the transistor 101 is turned on depending on the magnitude of the bias current IB1, the bias current IB1 reduces on the basis of the current I1 flowing through the transistor 101. This makes it possible to inhibit the transistor 101 from being turned on depending on the magnitude of the bias current IB1 in a low-output-power region where output power of the output signal RFout is low.

The power amplifier circuit 10 has the control voltage generation circuit 105. The control voltage generation circuit 105 operates so as to control the gate voltage of the transistor 103 in accordance with the reference voltage V3. The reference voltage V3 commensurate with the current amplification factor of the transistor 101 is supplied to the control voltage generation circuit 105 by, for example, the reference voltage generation circuit 106.

For example, when the current amplification factor of the transistor 101 increases due to, for example, heat generation of the transistor 101, output power from the transistor 101 increases to above a control target value. In this case, a case where output power from the power amplifier circuit 10 is controlled by the control voltage generation circuit 105 and the reference voltage generation circuit 106 will be described.

When the current amplification factor of the transistor 101 increases, the reference voltage generation circuit 106 reduces the reference voltage V3. The control voltage generation circuit 105 generates the control voltage V2 on the basis of the voltage V1 and the reference voltage V3. When the reference voltage V3 reduces, the control voltage generation circuit 105 reduces the control voltage V2. The reduction of the control voltage V2 means changing the control voltage V2 so as to reduce the absolute value of the gate voltage of the transistor 103.

When the control voltage V2 reduces, the bias voltage VB1 to be applied to the gate of the transistor 103 reduces. When the bias voltage VB1 reduces, the bias current IB1 reduces. The reduction in the bias current IB1 reduces the current I1. In this manner, increase in the current I1 is curbed. Thus, even if the current amplification factor of the transistor 101 increases, the output power from the power amplifier circuit 10 is appropriately controlled so as not to increase excessively by curbing increase in the current I1.

The power amplifier circuit 10 has the control current generation circuit 107. The control current generation circuit 107 performs control commensurate with a variation in the power supply voltage V that is supplied to the power amplifier circuit 10. For example, when the power supply voltage V increases, the bias current IB1 output by the transistor 103 increases. Thus, increase in the power supply voltage V increases the output power from the transistor 101.

Since this is not control based on the reference signal Vramp, the increase needs to be appropriately compensated for.

The power supply voltage V is also supplied to the control current generation circuit 107 (not shown). If the power supply voltage V changes to increase, the control current generation circuit 107 draws the control current IC1 from the reference voltage generation circuit 106 into the control current generation circuit 107. When the control current IC1 is drawn, the reference voltage generation circuit 106 reduces the reference voltage V3. When the reference voltage V3 reduces, the control voltage generation circuit 105 reduces the control voltage V2. Thus, as in the above-described case, the current I1 reduces consequently. With this reduction, increase in the output power from the transistor 101 due to increase in the power supply voltage V is compensated for, and the output power from the power amplifier circuit 10 is appropriately controlled.

Figure 2:
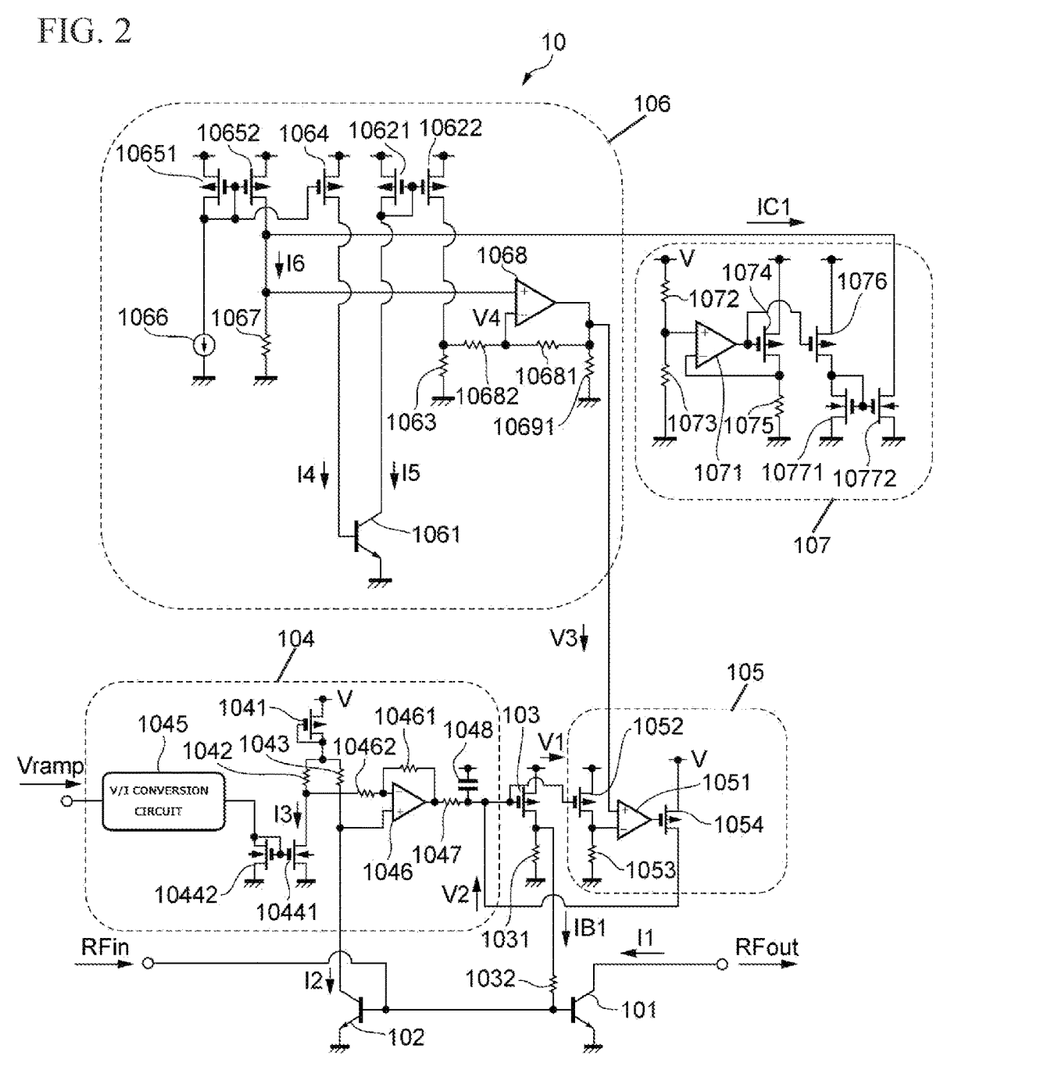
FIG. 2 is a circuit diagram of the power amplifier circuit according to the first embodiment.

Circuit details of the power amplifier circuit 10 will be described with reference to FIG. 2. A circuit of each portion of the control circuit 104, the control voltage generation circuit 105, the reference voltage generation circuit 106, and the control current generation circuit 107 is specifically shown in FIG. 2.

The control circuit 104 includes a transistor 1041, resistive elements 1042 and 1043, transistors 10441 and 10442, a V/I conversion circuit 1045, an error amplifier 1046, resistive elements 10461, 10462, and 1047, and a capacitor 1048.

In the transistor 1041, the power supply voltage is supplied to a source, and a gate and a drain are diode-connected. The drain of the transistor 1041 is connected to a drain of the transistor 10441 through the resistive element 1042. The drain of the transistor 1041 is also connected to the collector of the transistor 102 through the resistive element 1043. The transistor 1041 is a P-channel MOSFET.

The resistive elements 1042 and 1043 cause predetermined voltage drops commensurate with output currents from the transistor 1041. The resistive element 1042 causes a voltage drop commensurate with a reference current I3, and the resistive element 1043 causes a voltage drop commensurate with the current I2.

The transistors 10441 and 10442 are current-mirror-connected transistors. The transistors 10441 and 10442 are N-channel MOSFETs. The transistor 10442 is connected to the V/I conversion circuit 1045.

The reference signal Vramp is input to the V/I conversion circuit 1045. The V/I conversion circuit 1045 supplies a current commensurate with the reference signal Vramp to the transistor 10442. The current flowing through the transistor 10442 is mirrored by the transistor 10441 and becomes the reference current I3.

In the error amplifier 1046, an inverting input terminal is connected to the resistive element 1042 through the resistive element 10462. A noninverting input terminal of the error amplifier 1046 is connected between the resistive element 1043 and the collector of the transistor 102. The resistive element 10461 is provided between an output terminal and the inverting input terminal of the error amplifier 1046. The output terminal of the error amplifier 1046 is connected to the gate of the transistor 103 through the resistive element 1047.

For example, assume a case where, as a result of increase in the current I2 and increase in a voltage drop by the resistive element 1043, a difference between both the input terminals of the error amplifier 1046 increases. In this case, the error amplifier 1046 operates such that a voltage at the output terminal decreases. As a result, the voltage V1 supplied to the transistor 103 reduces.

The control voltage generation circuit 105 includes a differential amplifier 1051, a transistor 1052, a resistive element 1053, and a transistor 1054.

In the differential amplifier 1051, an inverting input terminal is connected to a drain of the transistor 1052, and a noninverting input terminal is connected to an output terminal of a differential amplifier 1068. In the differential amplifier 1051, an output terminal is connected to a gate of the transistor 1054. The transistors 1052 and 1054 are P-channel MOSFETs.

In the transistor 1052, a gate is connected in parallel with the gate of the transistor 103. The voltage V1 is supplied from the control circuit 104 to the gate of the transistor 1052. The transistor 1052 outputs a current commensurate with the voltage V1 from the drain. A voltage at the inverting input terminal of the differential amplifier 1051 is determined by the current and the resistive element 1053. In other words, a voltage commensurate with the voltage V1 is supplied to the inverting input terminal of the differential amplifier 1051.

In the transistor 1054, a source is connected to the power supply, and a drain is connected to the gate of the transistor 103. The transistor 1054 supplies the control voltage V2 to the gate of the transistor 103.

For example, if the voltage V1 has a value constant to some degree and changes such that a voltage at the noninverting input terminal reduces, the differential amplifier 1051 operates such that a voltage at the output terminal reduces. As a result, a voltage supplied to the transistor 1054 reduces. When a gate voltage of the transistor 1054 reduces, the control voltage V2 output by the transistor 1054 reduces.

The reference voltage generation circuit 106 includes a transistor 1061, transistors 10621 and 10622, a resistive element 1063, a transistor 1064, transistors 10651 and 10652, a current source 1066, a resistive element 1067, a differential amplifier 1068, resistive elements 10681 and 10682, and a resistive element 10691.

In the transistor 1061 (a fourth transistor), a base is connected to a drain of the transistor 1064, a collector is connected to a drain of the transistor 10621, and an emitter is connected to the ground.

The transistor 1061 is an element which has the same temperature characteristics as the transistor 101. If the transistor 101 is an FET or the like, an element for the transistor 1061 is appropriately replaced with an element which has the same characteristics as the transistor 101. A current I5 (a fourth current) commensurate with a current I4 (a third current) which is input to the base flows to the collector of the transistor 1061.

The transistors 10621 and 10622 are current-mirror-connected transistors. In the transistor 10622, a drain is connected to the ground through the resistive element 1063. The drain of the transistor 10622 is also connected to an inverting input terminal of the differential amplifier 1068 through the resistive element 10682. The transistors 10621 and 10622 are P-channel MOSFETs. The current I5 is mirrored by the transistors 10621 and 10622 and flows toward the resistive element 1063. A voltage V4 (a third reference voltage) at the inverting input terminal of the differential amplifier 1068 is determined in accordance with the current I5.

In the transistor 1064, a gate is connected to the current source 1066, and the drain is connected to the base of the transistor 1061. The transistor 1064 supplies the current I4 to the transistor 1061 in accordance with a current from the current source 1066.

The transistors 10651 and 10652 are current-mirror-connected transistors. In the transistor 10651, a drain is connected to the current source 1066. In the transistor 10652, a drain is connected to the ground through the resistive element 1067. The drain of the transistor 10652 is also connected to a noninverting input terminal of the differential amplifier 1068. The transistors 10651 and 10652 are P-channel MOSFETs. The current from the current source 1066 is mirrored by the transistors 10651 and 10652. A current I6 flows to the resistive element 1067 on the basis of the mirrored current. A voltage at the noninverting input terminal of the differential amplifier 1068 is determined in accordance with a voltage drop in the resistive element 1067.

The differential amplifier 1068 outputs a voltage commensurate with a difference between the voltage at the noninverting input terminal and the voltage at the inverting input terminal. In the differential amplifier 1068, an output terminal is connected to the noninverting input terminal of the differential amplifier 1051 and supplies the reference voltage V3 to the noninverting input terminal of the differential amplifier 1051.

For example, assume a case where, as a result of increase in the current I5 and increase in a voltage conversion value at the inverting input terminal of the differential amplifier 1068 due to the resistive element 1063, a difference between both the input terminals of the differential amplifier 1068 increases. In this case, the error amplifier 1068 operates such that a voltage at the output terminal reduces, which results in reduction in the reference voltage V3.

The control current generation circuit 107 includes a differential amplifier 1071, resistive elements 1072 and 1073, a transistor 1074, a resistive element 1075, a transistor 1076, and transistors 10771 and 10772.

In the differential amplifier 1071, a voltage divided by the resistive element 1072 and the resistive element 1073 is supplied to a noninverting input terminal. A voltage value of the noninverting input terminal changes in accordance with a variation in the power supply voltage. An output terminal of the differential amplifier 1071 is connected to a gate of the transistor 1074. A voltage generated by the transistor 1074 is input to an inverting input terminal of the differential amplifier 1071.

The output terminal of the differential amplifier 1071 is connected to a gate of the transistor 1076. The transistor 1076 is connected to the transistors 10771 and 10772 that are current-mirror-connected. A drain of the transistor 10772 is connected between the drain of the transistor 10652 and the resistive element 1067. The transistor 1076 supplies a current commensurate with an output voltage from the differential amplifier 1071 to the transistor 10771. The current commensurate with the output voltage from the differential amplifier 1071 is mirrored by the transistors 10771 and 10772. The mirrored current flows as the control current Id1 to the transistor 10772.

The control current generation circuit 107 functions as a circuit which detects a variation in the power supply voltage. When the power supply voltage increases, the control current Id1 increases. When the control current Id1 increases, the current I6 in the reference voltage generation circuit 106 reduces. The reduction in the current I6 reduces the reference voltage V3.

Figure 3:
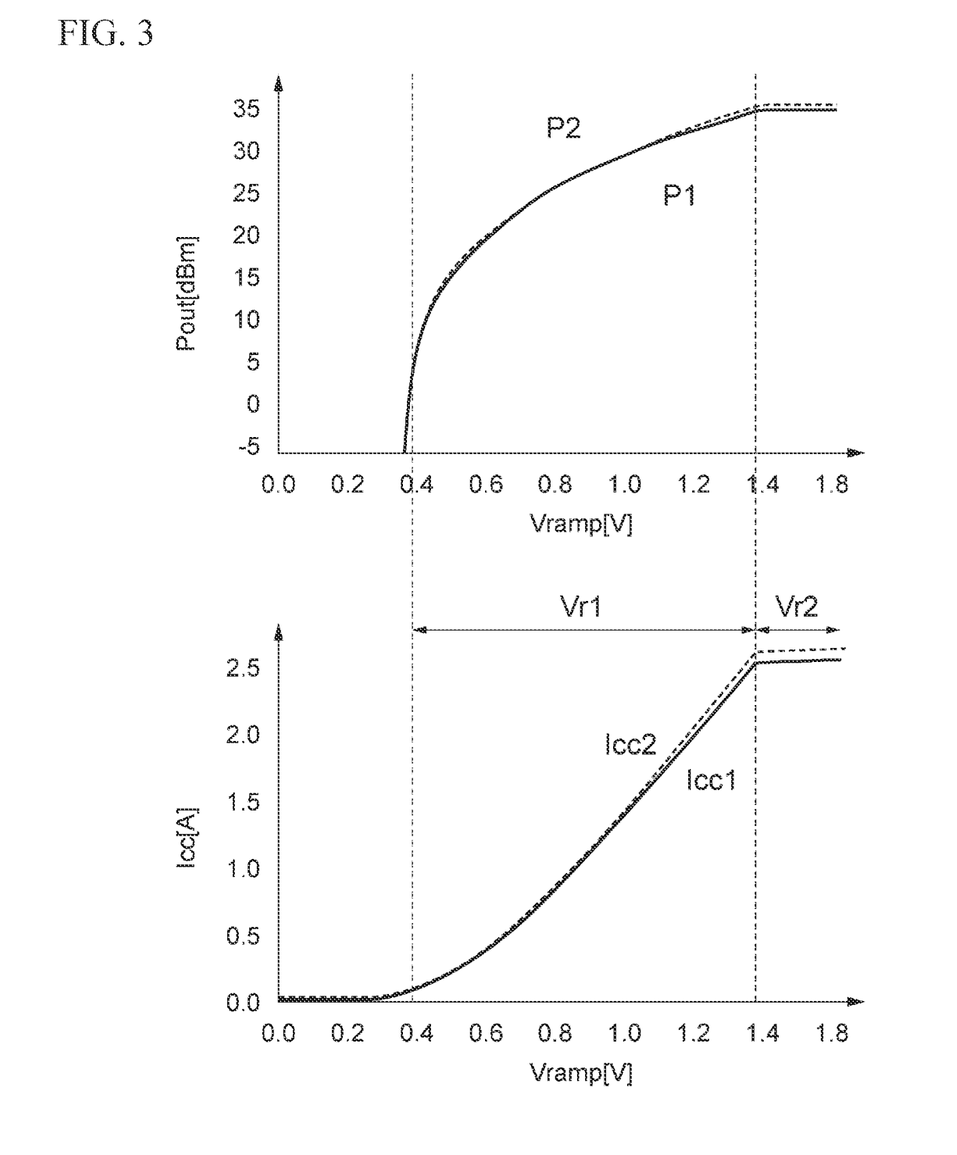
FIG. 3 shows graphs for explaining operation of the power amplifier circuit according to the first embodiment.

Improvement of output power controllability in the power amplifier circuit 10 will be described with reference to FIGS. 3 to 5. FIG. 3 shows graphs showing changes in output power Pout [dBm] and a collector current Icc [A] of the transistor 101 when the reference signal Vramp is varied in the power amplifier circuit 10. Referring to FIG. 3, improvement of the output power controllability in the power amplifier circuit 10 when there is a variation in the current amplification factor of the transistor 101 will be described.

In FIG. 3, output power P1 and a collector current Icc1 are indicated by solid lines, and output power P2 and a collector current Icc2 are indicated by dotted lines. The output power P1 and the collector current Icc1 are values when the current amplification factor of the transistor 101 is 30% smaller than a reference value. The output power P2 and the collector current Icc2 are results when the current amplification factor of the transistor 101 is 30% larger than the reference value.

In the above-described case, the output power P1 and the output power P2 are all shown to increase smoothly close to the target of 35 dBm within a voltage range Vr1. This is due to feedback control by the control circuit 104. If the control by the control circuit 104 is not performed, the output power Pout changes to have a larger value than in the case of FIG. 3, and the output voltage does not increase smoothly. The same applies to the collector current Icc1 and the collector current Icc2.

The output power P1 and the output power P2 are all shown to stably have values close to the target of 35 dBm within a voltage range Vr2. This is because a difference in current amplification factor is compensated for by the control voltage generation circuit 105 and the reference voltage generation circuit 106 in a high-output region where a difference in current amplification factor has a great effect. If control by the control voltage generation circuit 105 and the reference voltage generation circuit 106 is not performed, the output power Pout changes to have a larger value than in the case of FIG. 3. The same applies to the collector current Icc1 and the collector current Icc2.

Figure 4:
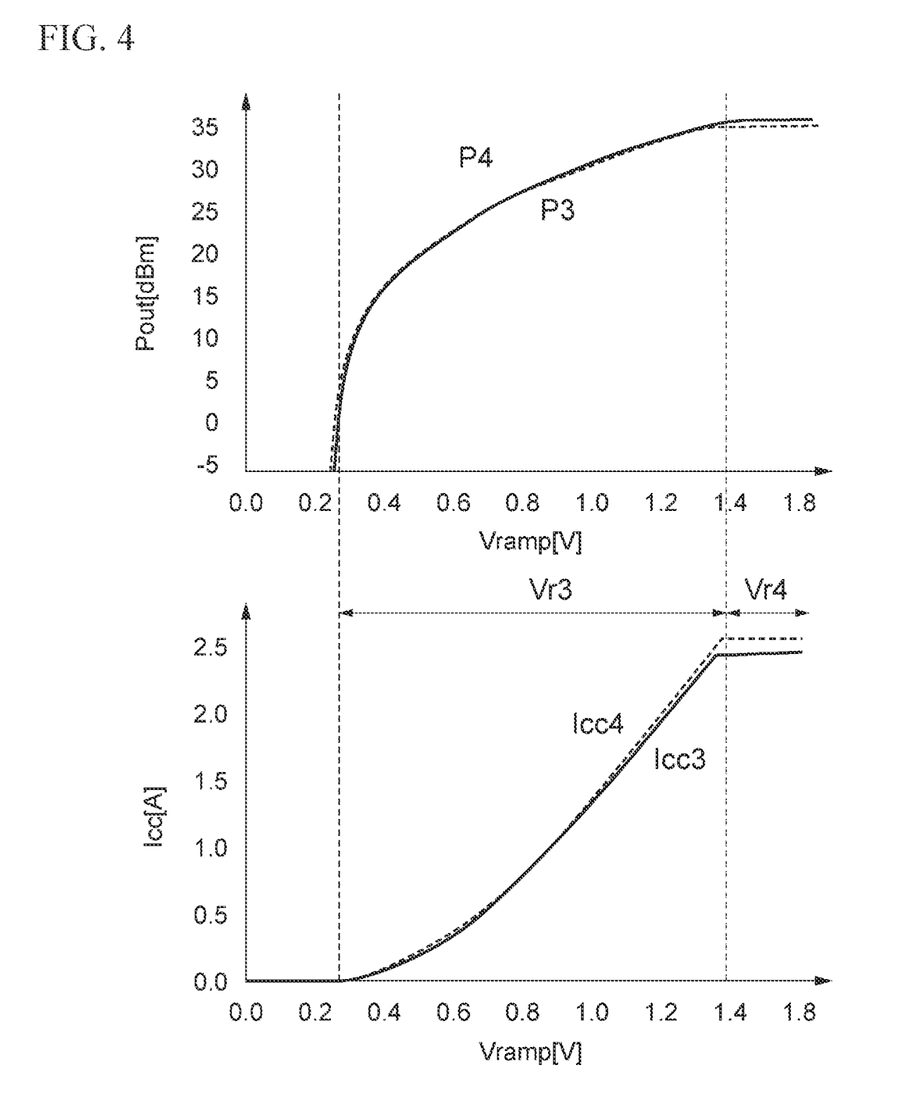
FIG. 4 shows graphs for explaining the operation of the power amplifier circuit according to the first embodiment.

FIG. 4 shows graphs similar to those in FIG. 3. Referring to FIG. 4, improvement of the output power controllability in the power amplifier circuit 10 when there is a change in the external environmental temperature of the transistor 101 and amplification characteristics of the transistor 101 change will be described.

In FIG. 4, output power P3 and a collector current Icc3 are indicated by solid lines, and output power P4 and a collector current Icc4 are indicated by dotted lines. The output power P3 and the collector current Icc3 are values when the environmental temperature of the transistor 101 is 30° C. lower than a reference value. The output power P4 and the collector current Icc4 are results when the environmental temperature of the transistor 101 is 85° C. higher than the reference value.

Even in the above-described case, as in FIG. 3, the output power P3 and the output power P4 are all shown to increase smoothly close to the target of 35 dBm within a voltage range Vr3. The same applies to the collector current Icc3 and the collector current Icc4.

As in FIG. 3, the output power P3 and the output power P4 are all shown to stably have values close to the target of 35 dBm within a voltage range Vr4. This is because a difference in environmental temperature is compensated for by the control voltage generation circuit 105 and the reference voltage generation circuit 106 in the high-output region where a difference in environmental temperature has a great effect. The same applies to the collector current Icc3 and the collector current Icc4.

Figure 5:
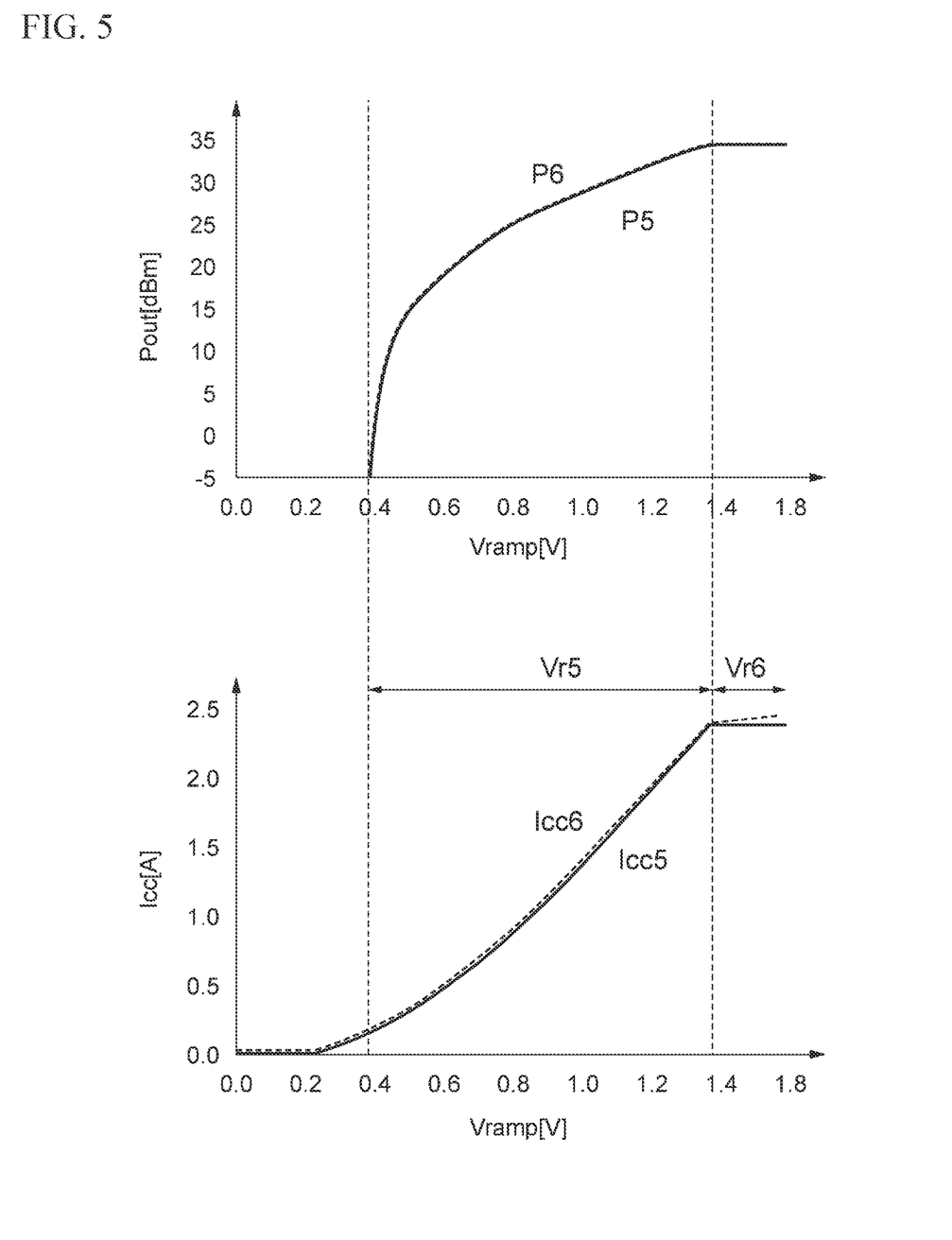
FIG. 5 shows graphs for explaining the operation of the power amplifier circuit according to the first embodiment.

FIG. 5 shows graphs similar to those in FIG. 3.

Referring to FIG. 5, improvement of the output power controllability in the power amplifier circuit 10 when the power supply voltage supplied to the power amplifier circuit 10 changes will be described.

In FIG. 5, output power P5 and a collector current Icc5 are indicated by solid lines, and output power P6 and a collector current Icc6 are indicated by dotted lines. The output power P5 and the collector current Icc5 are values when the power supply voltage of the power amplifier circuit 10 is 3.5 V. The output power P6 and the collector current Icc6 are results when the power supply voltage of the power amplifier circuit 10 is 4.5 V.

Even in the above-described case, as in FIG. 3, the output power P5 and the output power P6 are all shown to increase smoothly close to the target of 35 dBm within a voltage range Vr5. The same applies to the collector current Icc5 and the collector current Icc6.

As in FIG. 3, the output power P5 and the output power P6 are all shown to stably have values close to the target of 35 dBm within a voltage range Vr6. This is because a difference in power supply voltage is compensated for by the control current generation circuit 107 that generates the control current IC1 based on the power supply voltage as well as the control voltage generation circuit 105 and the reference voltage generation circuit 106 in the high-output region where a difference in power supply voltage has a great effect. The same applies to the collector current Icc5 and the collector current Icc6.

Figure 6:
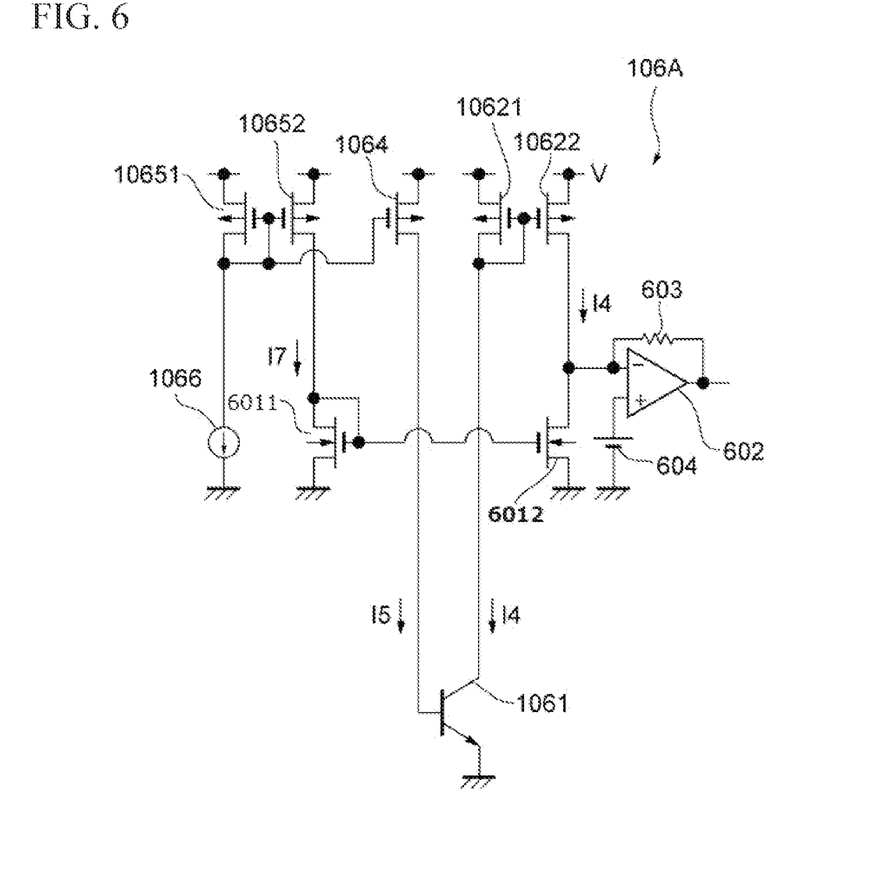
FIG. 6 is another circuit diagram of a reference voltage generation circuit according to the first embodiment.

A reference voltage generation circuit 106A is shown in FIG. 6 as another example of the reference voltage generation circuit 106.

The reference voltage generation circuit 106A includes transistors 6011 and 6012, a transimpedance amplifier 602, a resistive element 603, and a voltage source 604. The transistor 10621 generates a current I4 which is obtained by multiplying a current I5 supplied to a base of the transistor 1061 by a predetermined current amplification factor of the transistor 1061. The current I4 is mirrored by the transistor 10622. In the reference voltage generation circuit 106A, a current which is a difference between the current I4 generated by the transistor 1061 and the transistors 10621 and 10622 and a current I7 which is obtained when the current I4 is mirrored by the transistor 6011 is input to an inverting input terminal of the transimpedance amplifier 602.

If there is a change which increases the current amplification factor of the transistor 1061, the current I4 increases. This increases a current which flows to the transimpedance amplifier 602. A voltage drop by the resistive element 603 increases. The transimpedance amplifier 602 operates so as to reduce a voltage at an output terminal such that a voltage at the inverting input terminal is the same as a voltage at a noninverting input terminal. That is, a reference voltage V3 reduces. The reference voltage generation circuit 106 can be replaced with the configuration of the reference voltage generation circuit 106A.

A second embodiment will be described. In each of the second embodiment and subsequent embodiments, a description of matters shared with the first embodiment will be omitted, and only differences will be described. In particular, a same operational effect of a same configuration will not be mentioned in each embodiment.

Figure 7:
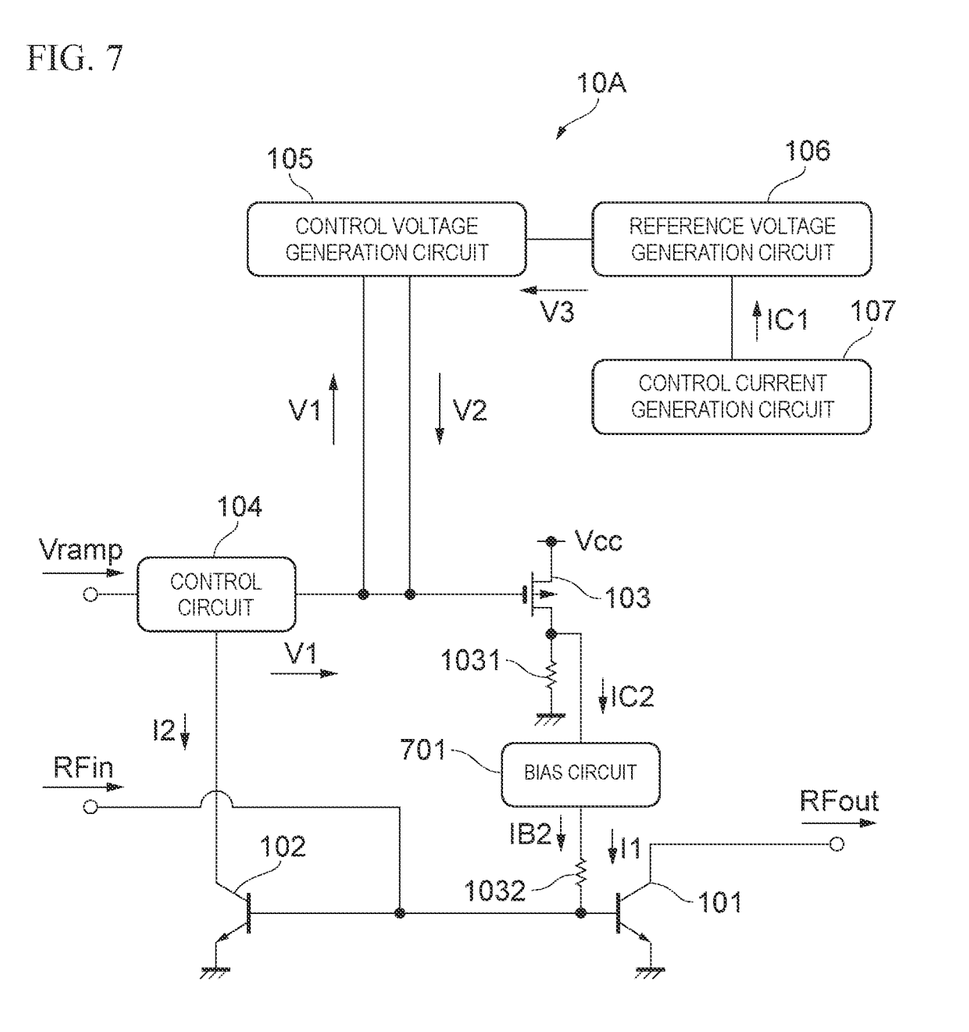
FIG. 7 is a schematic circuit diagram of a power amplifier circuit according to a second embodiment.

A schematic circuit diagram of a power amplifier circuit 10A according to a second embodiment is shown in FIG. 7. The power amplifier circuit 10A is different from the power amplifier circuit 10 in that a bias circuit 701 is provided between a transistor 103 and a resistive element 1032.

In the power amplifier circuit 10A, the transistor 103 outputs a bias control signal IC2 to the bias circuit 701. The bias circuit 701 supplies a bias current IB2 to transistors 101 and 102 on the basis of the bias control signal IC2. In the power amplifier circuit 10A, output power controllability can be improved using a control circuit 104, a control voltage generation circuit 105, a reference voltage generation circuit 106, and a control current generation circuit 107, as in the power amplifier circuit 10.

Figure 8:
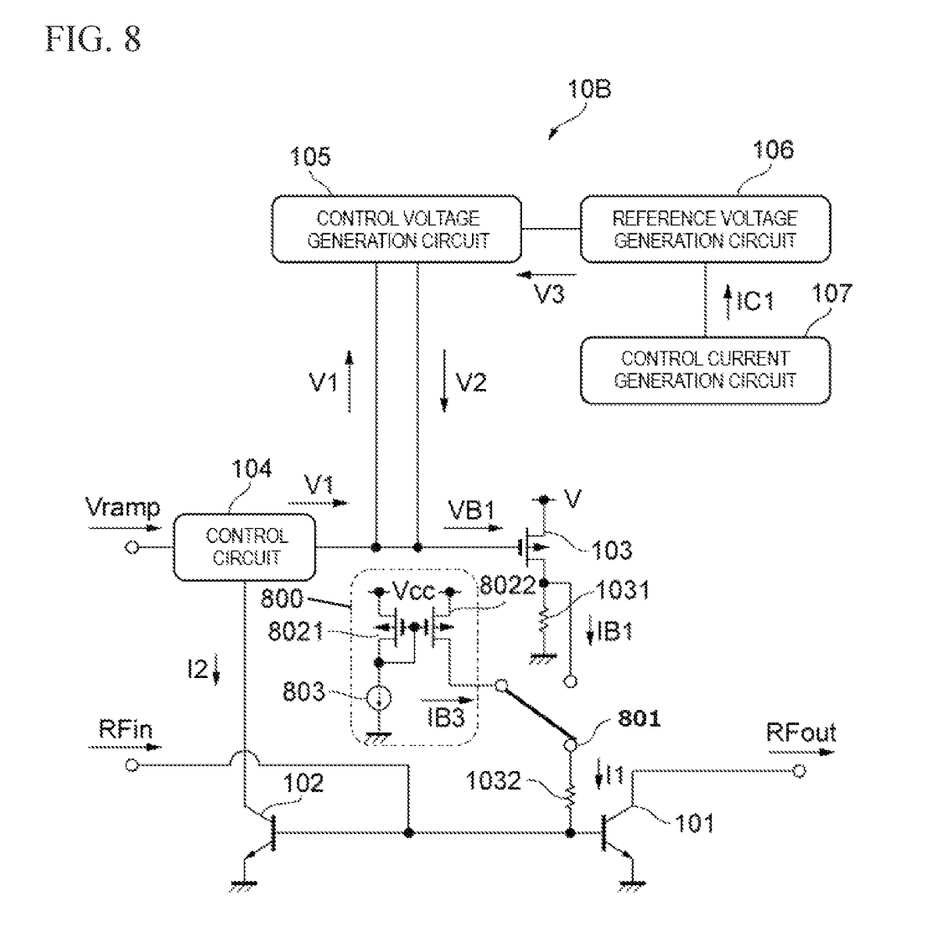
FIG. 8 is a schematic circuit diagram of a power amplifier circuit according to a third embodiment.

A third embodiment will be described. A schematic circuit diagram of a power amplifier circuit 10B according to a third embodiment is shown in FIG. 8. The power amplifier circuit 10B is different from the power amplifier circuit 10 in that the power amplifier circuit 10B has a bias supply circuit 800 and a switch 801.

In the switch 801, an input is connected to a transistor 103 and a transistor 8022, and an output is connected to a resistive element 1032.

The bias supply circuit 800 is a common bias circuit which has a transistor 8021, the transistor 8022, and a current source 803 and outputs a predetermined bias current IB3. In the power amplifier circuit 10B, a bias current to be supplied to the transistor 101 is switched between a bias current IB1 (a first bias current) and the bias current IB3 (a second bias current) in accordance with a control signal which is input to the switch 801. The power amplifier circuit 10B is capable of further performing output power control by a method that varies power of an input signal RFin to the transistor 101 while keeping a gain of the transistor 101 constant by allowing supply of a predetermined bias current.

Figure 9:
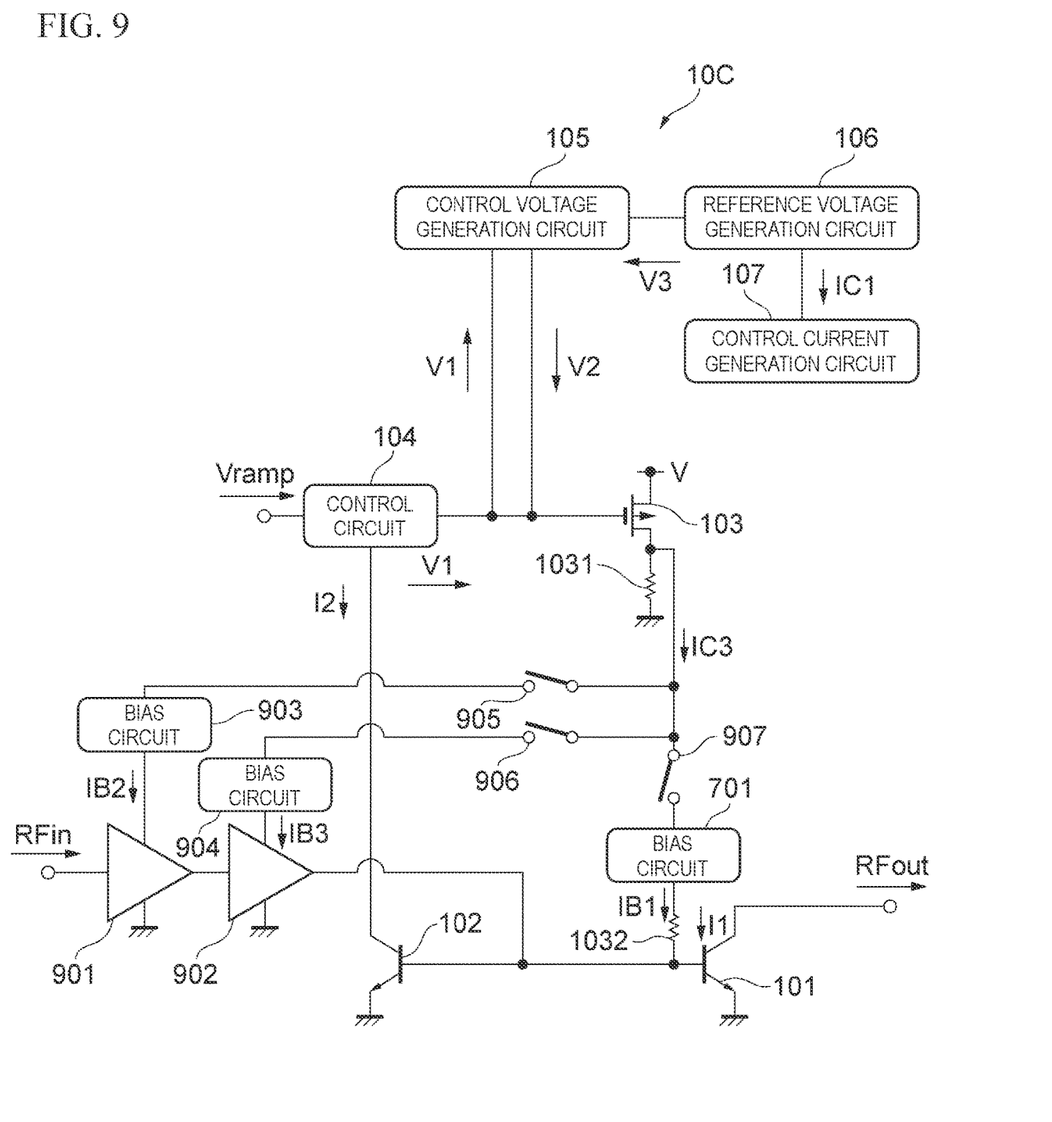
FIG. 9 is a schematic circuit diagram of a power amplifier circuit according to a fourth embodiment.

A fourth embodiment will be described. A schematic circuit diagram of a power amplifier circuit 10C according to the fourth embodiment is shown in FIG. 9. The power amplifier circuit 10C has a configuration obtained by further providing the power amplifier circuit 10A with amplifiers 901 and 902, bias circuits 903 and 904, and switches 905, 906, and 907. The amplifiers 901 and 902 amplify an input signal stepwise. The bias circuits 903 and 904 supply bias currents IB2 and IB3 to the amplifiers 901 and 902, respectively.

The switches 905, 906, and 907 are controlled by an external control signal, and are on when the power amplifier circuit 10C operates. A transistor 103 is controlled in accordance with a current I1 which flows to a collector of a transistor 101. A bias control signal IC3 from the transistor 103 is supplied to the bias circuits 903 and 904 in addition to a bias circuit 701. The bias circuits 903 and 904 output the bias currents IB2 and IB3 in accordance with the bias control signal IC3. Output power controllability can also be improved by the power amplifier circuit 10C.

Exemplary embodiments of the present disclosure have been described above. Note that, in each of the above-described embodiments, each circuit may be provided on one chip using, for example, a Bi-CMOS process. Alternatively, each circuit may be provided over a plurality of chips depending on a transistor to be used.

The power amplifier circuit 10 includes: the transistor 101 which is supplied at a base with the bias current IB1, amplifies the input signal RFin, and outputs the current I1; the transistor 102 which is connected at a base to the base of the transistor 101 and in which the current I2 commensurate with the current I1 is input to a collector; the transistor 103 which outputs a bias control signal which controls supply of the bias current IB1; and the control circuit 104 which is connected to the collector of the transistor 102 and a gate of the transistor 103 and controls a bias control signal on the basis of the reference current I3 based on the reference signal Vramp and the current I2.

With the above-described configuration, increase in the current I1 that flows to the collector of the transistor 101 is detected by the transistor 102 and the control circuit 104. The control circuit 104 can curb a variation in the current I1 by controlling the bias control signal in accordance with the variation in the current I1. Thus, the output power controllability in the power amplifier circuit 10 improves.

The power amplifier circuit 10 further includes the control voltage generation circuit 105 which is connected to the gate of the transistor 103 and supplies the control voltage V2 to the gate of the transistor 103 on the basis of the voltage V1 based on the bias current IB1 and the reference voltage V3 commensurate with operation of the transistor 101. With this configuration, the control voltage V2 is supplied on the basis of a result of changing of the reference voltage V3 in accordance with operation of the transistor 101. The control voltage V2 is supplied to the gate of the transistor 103, thereby controlling the bias control signal. This allows curbing of a variation in the current I1. Thus, the output power controllability in the power amplifier circuit 10 improves.

The power amplifier circuit 10 further includes the reference voltage generation circuit 106 which is connected to the control voltage generation circuit 105, has the transistor 1061, the transistor 1061 being supplied at a base with the current I4 and outputting the current I5 commensurate with a variation in a current amplification factor of the transistor 101 from a collector on the basis of the current I4, generates the reference voltage V3 on the basis of a voltage commensurate with the current I5, and supplies the reference voltage V3 to the control voltage generation circuit 105.

With the transistor 1061, the current I5 commensurate with a variation in the current amplification factor of the transistor 101 can be obtained. The reference voltage generation circuit 106 generates the reference voltage V3 on the basis of the current I5. The control voltage V2 is controlled in accordance with the reference voltage V3, which allows curbing of a variation in the current I1. Thus, the output power controllability in the power amplifier circuit 10 improves.

The power amplifier circuit 10 further includes the control current generation circuit 107 that is connected to the reference voltage generation circuit 106, generates the control current Id1 on the basis of a variation in the power supply voltage V, and supplies the control current Id1 to the reference voltage generation circuit 106. The reference voltage generation circuit 106 generates the reference voltage V3 on the basis of the voltage commensurate with the current I5 and a control current.

The above-described configuration makes it possible to take into account effects of a variation in the power supply voltage V at the time of generation of the reference voltage V3. The control voltage V2 is controlled in accordance with the reference voltage V3, which allows curbing of a variation in the current I1. Thus, the output power controllability in the power amplifier circuit 10 improves.

The power amplifier circuit 10B further includes: the bias supply circuit 800 which supplies a bias current to the transistor 101 and the transistor 102; and the switch 801 which is connected to the transistor 103 and the bias supply circuit 800 and switches between connection of the transistor 101 and the transistor 103 or connection of the transistor 101 and the bias supply circuit 800.

The power amplifier circuit 10B is capable of selectively performing, through flipping of the switch 801, output power control by a method that varies power of the input signal RFin to the transistor 101 and output power control by a method that varies the gain of the transistor 101.

Note that each of the embodiments is described above for facilitating the understanding of the present disclosure, and is not described for limiting the interpretation of the present disclosure. The present disclosure can be modified/improved without necessarily departing from the spirit thereof, and the present disclosure also includes an equivalent thereof. That is, each embodiment whose design is appropriately changed by those skilled in the art is also included in the scope of the present disclosure as long as the embodiment has the features of the present disclosure. For example, elements included in each embodiment and those arrangement, materials, conditions, shapes, sizes, and the like are not limited to those exemplified, and can be appropriately changed. Further, each of the embodiments is exemplary and it goes without necessarily saying that partial substitution or combination of the configurations described in different embodiments can be performed, and this is also included in the scope of the present disclosure as long as the features of the present disclosure are included.

What is claimed is:

1. A power amplifier circuit comprising:
   a first transistor configured to receive a bias current at a base or a gate of the first transistor, to amplify an input signal, and to output a first current;
   a second transistor that has a base or a gate that is connected to the base or the gate of the first transistor, and that is configured to receive a second current commensurate with the first current at a collector or a drain of the second transistor;
   a third transistor configured to output a bias control signal, the bias control signal being configured to control a supply of the bias current;
   a control circuit connected to the collector or the drain of the second transistor and to a base or a gate of the third transistor, and that is configured to control the bias control signal based on a reference current, the reference current being based on a reference signal and the second current; and
   a control voltage generation circuit connected to the base or the gate of the third transistor, and configured to supply a control voltage to the base or the gate of the third transistor based on a first reference voltage, the first reference voltage being based on the bias current and a second reference voltage commensurate with operation of the first transistor.

2. The power amplifier circuit according to claim 1, further comprising:
   a reference voltage generation circuit connected to the control voltage generation circuit and comprising a fourth transistor,
   wherein the fourth transistor is configured to receive a third current at a base or a gate of the fourth transistor, and is configured to output a fourth current from a collector or a drain of the fourth transistor based on the third current, the fourth current being commensurate with a variation in a current amplification factor of the first transistor, and
   wherein the reference voltage generation circuit is configured to generate the second reference voltage based on a third reference voltage commensurate with the fourth current, and to supply the second reference voltage to the control voltage generation circuit.

3. The power amplifier circuit according to claim 2, further comprising:
   a control current generation circuit connected to the reference voltage generation circuit, and configured to generate a control current based on a variation in a power supply voltage, and to supply the control current to the reference voltage generation circuit, wherein the reference voltage generation circuit is configured to generate the second reference voltage based on the third reference voltage and the control current.

4. The power amplifier circuit according to claim 2, wherein:
   the bias current is a first bias current, and
   the power amplifier circuit further comprises:
   a bias supply circuit configured to supply a second bias current to the first transistor and to the second transistor, and
   a switch connected to the third transistor and to the bias supply circuit, and configured to selectively connect the first transistor to the third transistor or to the bias supply circuit.

5. The power amplifier circuit according to claim 2, wherein:
   the bias current is a first bias current, and
   the power amplifier circuit further comprises:
   a bias supply circuit configured to supply a second bias current to the first transistor and to the second transistor, and
   a switch connected to the third transistor and to the bias supply circuit, and configured to selectively connect the first transistor to the third transistor or to the bias supply circuit.

6. The power amplifier circuit according to claim 3, wherein:
   the bias current is a first bias current, and
   the power amplifier circuit further comprises:
   a bias supply circuit configured to supply a second bias current to the first transistor and to the second transistor, and
   a switch connected to the third transistor and to the bias supply circuit, and configured to selectively connect the first transistor to the third transistor or to the bias supply circuit.

7. A power amplifier circuit comprising:
   a first transistor configured to receive a first bias current at a base or a gate of the first transistor, to amplify an input signal, and to output a first current;
   a second transistor that has a base or a gate that is connected to the base or the gate of the first transistor, and that is configured to receive a second current commensurate with the first current at a collector or a drain of the second transistor;
   a third transistor configured to output a bias control signal, the bias control signal being configured to control a supply of the first bias current; and
   a control circuit connected to the collector or the drain of the second transistor and to a base or a gate of the third transistor, and that is configured to control the bias control signal based on a reference current, the reference current being based on a reference signal and the second current;
   a bias supply circuit configured to supply a second bias current to the first transistor and to the second transistor; and
   a switch connected to the third transistor and to the bias supply circuit, and configured to selectively connect the first transistor to the third transistor or to the bias supply circuit.

* * * * *

UNITED STATES PATENT AND TRADEMARK OFFICE
CERTIFICATE OF CORRECTION

| | |
|---|---|
| PATENT NO. | : 12,424,982 B2 |
| APPLICATION NO. | : 17/808624 |
| DATED | : September 23, 2025 |
| INVENTOR(S) | : Takashi Soga et al. |

Page 1 of 1

It is certified that error appears in the above-identified patent and that said Letters Patent is hereby corrected as shown below:

In the Specification

Column 7, Line 53, "the control current Id1" should be --the control current IC1--

Column 7, Line 58, "Id1 increases. When the" should be --IC1 increases. When the--

Column 7, Line 58, "current Id1 increases," should be --current IC1 increases,--

Column 11, Line 40, "current Id1 on the basis of" should be --current IC1 on the basis of--

Column 11, Line 41, "control current Id1 to the" should be --control current IC1 to the--

Signed and Sealed this
Twenty-fifth Day of November, 2025

John A. Squires
*Director of the United States Patent and Trademark Office*